(12) United States Patent
Calogero et al.

(10) Patent No.: US 8,748,738 B2
(45) Date of Patent: Jun. 10, 2014

(54) PROCESS FOR OBTAINING STABLE EXTRACT OF SENSITIZING BETALAIONIC DYE

(75) Inventors: Giuseppe Calogero, Messina (IT); Gaetano Di Marco, Messina (IT)

(73) Assignee: Consiglio Nazionale delle Ricerche, Rome (IT)

( * ) Notice: Subject to any disclaimer, the term of this patent is extended or adjusted under 35 U.S.C. 154(b) by 180 days.

(21) Appl. No.: 13/124,683

(22) PCT Filed: Oct. 15, 2009

(86) PCT No.: PCT/IT2009/000468
§ 371 (c)(1),
(2), (4) Date: Jun. 9, 2011

(87) PCT Pub. No.: WO2010/044122
PCT Pub. Date: Apr. 22, 2010

(65) Prior Publication Data
US 2012/0125439 A1 May 24, 2012

(30) Foreign Application Priority Data
Oct. 16, 2008 (IT) .............................. MI2008A1844

(51) Int. Cl.
*H01L 51/46* (2006.01)

(52) U.S. Cl.
USPC .............................. 136/263; 426/655; 427/58

(58) Field of Classification Search
USPC .............................. 426/655; 136/263; 427/58
See application file for complete search history.

(56) References Cited

U.S. PATENT DOCUMENTS

| | | | | |
|---|---|---|---|---|
| 4,027,042 A | * | 5/1977 | von Elbe et al. | 426/51 |
| 4,118,516 A | * | 10/1978 | Van Praag et al. | 426/96 |
| 4,409,254 A | * | 10/1983 | Garin et al. | 426/540 |
| 4,699,664 A | * | 10/1987 | Hettiarachchy et al. | 106/419 |
| 2005/0067006 A1 | * | 3/2005 | Eckert et al. | 136/244 |
| 2008/0210302 A1 | * | 9/2008 | Gupta | 136/260 |
| 2008/0273240 A1 | * | 11/2008 | Danzebrink et al. | 359/359 |

OTHER PUBLICATIONS

Calogero et al., "Red Sicilian orange and purple eggplant fruits as nature sensitizers for dye-sensitized solar cells", Solar Energy Materials and Solar Cells, Elsevier Science Publishers, Amsterdam, NL, vol. 92, No. 11, Jun. 20, 2008, pp. 1341-1346.

Wongcharee et al., "Dye-sensitized solar cell using natural dyes extracted from rosella and blue pea flowers", Solar Energy Materials and Solar Cells, Elsevier Science Publishers, Amsterdam, NL, vol. 91, No. 7, Feb. 20, 2007, pp. 566-571.

Cherepy et al., "Ultrafast Electron Injection: Implications for a Photoelectrochemical Cell Utilizing an Anthocyanin Dye-Sensitized TiO Nanocrystalline Electrode", Journal of Physical Chemistry. B, Materials, Surfaces, Interfaces and Biophysical, Washington, DC, US, vol. 101, No. 45, Jan. 1, 1997, pp. 9342-9351.

Laleh et al., "The Effect of light, temperature, pH and species of stability of anthocyanin pigments in four *berberis* species", Pakistan Journal of Nutrition, vol. 5, No. 1, 2006, pp. 90-92.

Malien-Aubert et al., "Color stability of commercial anthocyanin-based extracts in relation to the ephenolic composition. Protective effects by intra- and intermolecular copigmentation", J. Agric. Food. Chem., vol. 49, 2001, pp. 170-176.

Guo et al., "Photoelectrochemical studies of nanocrystalline TiO2 co-sensitized by novel cyanine dyes", Solar Energy Material and Solar Cells, Elsevier Science Publishers, Amsterdam, NL, vol. 88, No. 1, Jun. 15, 2005, pp. 23-35.

* cited by examiner

*Primary Examiner* — Anthony Weier
(74) *Attorney, Agent, or Firm* — Shoemaker and Mattare

(57) ABSTRACT

The present invention relates to the use of sensitizing dyes of natural origin in the photoelectrochemical solar cells and to the process for obtaining such vegetal extracts from fruits and vegetables.

1 Claim, 4 Drawing Sheets

PROCESS FOR OBTAINING STABLE EXTRACT OF SENSITIZING BETALAIONIC DYE

TECHNICAL FIELD OF THE INVENTION

The present invention relates to the use of natural dyes belonging to the group of anthocyanins [1,2], to the family of betalains [3], and of their derivatives of vegetal or synthetic origin, as sensitizers in the photoelectrochemical solar cells [4]. The invention further comprises a method for the extraction and the stabilization of the extracts of said dyes, as well as the realization of photoelectrochemical solar cells comprising such dyes.

STATE OF THE ART

It is known that it is possible to convert the solar energy into electric energy [4]; several attempts to use natural dyes or pigments in the photoelectrochemical solar cells to produce electric energy [5-18] have been undertaken in the past.

The dye-sensitized nanocrystalline photoelectrochemical solar cells, also known as Dye Sensitized Solar Cells (DSSC) have been invented about 18 years ago [1], and are composed of (see FIG. 1) a negative electrode, named photoanode, which comprises a matrix made of glass or other material that is transparent to solar radiation, having a spectral range comprised between the visible and the near infrared, and made electrical conductive by means of a thin layer of Indium oxide and tin oxide (ITO), or of fluorine-doped Tin dioxide (FTO). Titanium or Zinc oxide semiconductor nanocrystals are deposited upon this support, having a thickness of about 10-20 µm, thus forming a matrix to which a sensitizing dye is adsorbed. This, indeed, sensitizes the matrix that houses it by extending its absorption properties (see FIG. 2) in the visible region, and in some cases also in the infrared one. An electrolytic solution containing an electron mediator is also adsorbed by capillarity on the thus-prepared electrode. This last one has the function of transferring electrons from the counter electrode (cathode) to the dye, regenerating the fundamental state (reduction process) in the sensitizer. Once this phase has been completed, the operation is ended by coupling the cathode to the photoanode. This can be made of the same conductive glass used for the photoanode, or with a metallic support, or after making them conductive, with plastic supports; a catalyst, generally based on platinum, carbon, or gold is deposited on the conductive part in relation to the electron mediator selected.

In principle, the photophysical and photochemical properties of some dyes are exploited, which have the property of absorbing energy, when they are hit by the solar electromagnetic radiation, above all, when their characteristic absorption spectrum falls within that covered by the spectral distribution of the radiation source. The thus-absorbed energy brings the dye molecule to a higher energetic state, referred to as the excited state, from which the electrons are promoted to the semiconductor conduction band, i.e., the Titanium or Zinc oxide, on which the dye molecule has been previously bonded. This process, which takes place within the photoanode, generates an electron charge excess in the conduction band, and an electron vacation in the dye molecule. The electron charge excess is transferred to the cathode and the circuit is thus closed by the electron mediator interposed between the two electrodes, which fills the electron vacation. The mediator, for example, can be the pair Iodine/Iodide ion, and the reaction that neutralizes the electron vacation can be exemplified as follows: $2S^+ + 3I^- \rightarrow 2S + O_3^-$, wherein $S^+$ represents the oxidized state of the dye caused by the electronic transition towards the conduction band, while S represents the reduced state due to the intervention of the iodide ion $I^-$.

The iodide ions are subsequently regenerated to the counterelectrode, where the electron charge excess is capable of reducing the Iodine to Iodide ion. This multielectronic process is promoted and accelerated by the presence of the platinum or graphite catalyst. By connecting to the two electrodes some wires, with the aid of some clamps, it is possible to obtain electric energy, useful to supply electrical and electronical apparatuses. The maximum power that such device can develop is given by the product of the supplied current multiplied by the detected potential difference, when the cell is subjected to the maximal electrical charge that it supports. A theoretical parameter used to characterize the photoelectrochemical cell is the photo-action spectrum (or IPCE, Incident Photocurrent Efficiency). Some IPCE graphs of the solar cells with natural dyes are reported in FIG. 3.

The dyes used in the photoelectrochemical solar cells can be artificial or natural dyes. The artificial ones can be either of an organic or inorganic nature; these have the characteristic of exhibiting sufficiently high yields, but they have several drawbacks, such as, for example, the high production costs, a certain toxicity, that also involves the waste products deriving from their preparation and the scarce ecosustainability, as they are neither recyclable nor biodegradable. Furthermore, for the application in the photoelectrochemical cells, only the inorganic dyes ensure a functioning stability proximal to some tens of years, while the artificial organic ones do not result to be as stable and efficient.

Again, the large scale use of the latter ones has been so far hindered due to problems relating to their preparation costs and their degradability. Instead, as for the use of the solutions containing natural dyes and/or their derivatives, this is subject to several limitations; for example, they have low quantum yields of light to electric power conversion, defined as IPCE, with consequent low efficiency of energy yield, and furthermore, to slow down their degradation, they have to be stored at a temperature lower than the room temperature, however reaching a preservability of only a week. To maintain such solutions for longer periods, on the order of some months, it is necessary to recur to the pasteurization, concentration, freeze-drying, freezing, or conservation with inert gas, according to procedures that are expensive and that can involve a partial alteration of the dyes themselves.

As it is known, the natural extracts from products of vegetal origin can be treated with acid in order to increase their sensitizing properties [9-11,16]. Again, there are also known methods for the extraction of natural dyes with alcoholic solvents, but these involve a partial denaturation of the product and do not confer a longer functioning period to the device that contains it, their functioning stability duration as reported in the literature being no more than 6 hours of continuous illumination under sunlight irradiation.

OBJECT OF THE INVENTION

Therefore, it represents an object of the present invention a photoelectrochemical solar cell comprising a photoanode constituted of a nanocrystalline film of semiconductor material deposited on a support in glass or in other material transparent to the solar radiation, to which a sensitizing anthocyanin and/or betalain dye has been adsorbed, or a mixture of sensitizing anthocyanin dyes of vegetal origin, or mixtures of both. As the cathode, besides the conventional ones, supports different from glass or metal, such as ceramic, bricks, tiles, wood, and fabrics, all suitably made conductive and coated with catalyst, have been used.

Particularly, the sensitizing dyes can be obtained from vegetal products, as per the following description and appended claims.

In a preferred aspect, the natural sources for obtaining the dyes have been: Sicily blood oranges (*Citrus sinensis*), red mulberry (*Mores rubra*), sour cherries (*Prunus cerasus*), black plums (*Prunus domestica*), grapes and red wines (*Vitis vinifera*), red or Treviso radicchio (*Cichorium intybus*), aubergine (*Solanum melongena*), violet cauliflower (*Brassica oleracea var. botrytis*), and Indian fig (*Opuntia-Ficus Indica*).

In a still more preferred aspect, the dye used in the present invention is a mixture of Moro dye and Radicchio dye, hereinafter referred to as "Silorio_MIX".

A second object of the present invention relates to a process for obtaining stable extracts of the sensitizing dyes of vegetal origin from the pulp or juice of vegetal products.

A third aspect relates to a process for obtaining stable extracts of the sensitizing dyes of vegetal origin from the peel of a vegetal product containing chlorophyll, and, in a preferred aspect, from the aubergine or grapes skins.

A further object of the present invention relates to a process for the preparation of a photoelectrochemical cell that employs the dyes of the present invention.

A still further object of the present invention relates to the process for obtaining the sensitizing dye of the invention from the aubergine peel.

SUMMARY OF THE INVENTION

The present invention relates to the use of anthocyanins and/or betalains of natural origin in photoelectrochemical solar cells. Particularly, the harvest times have been identified and the treating methods have been defined for the vegetal material that ensures the major concentration of dyes in the vegetal products they are obtained from. Furthermore, the extraction methods of the compounds have been devised to ensure a higher stability thereof, and therefore a higher duration of the use of the dyes obtained from vegetal products. Furthermore, in a particular aspect, mixtures of the dyes of the invention have been studied, which are able to provide particularly advantageous performances. Furthermore, a photoelectrochemical solar cell has been realized with the use of the dyes of the invention. Finally, the previously mentioned possibility to use, for the cathode, different supports from glass allows both a better architectural and aesthetic integration of the device that is the object of the present invention and a saving in the installation costs, promoting their insertion in floor or wall tiles, furniture, toys, cars, railway carriages, clothes and garments in general, sails, tents, beach umbrellas, etc.

DETAILED DESCRIPTION OF THE INVENTION

Figure 1:
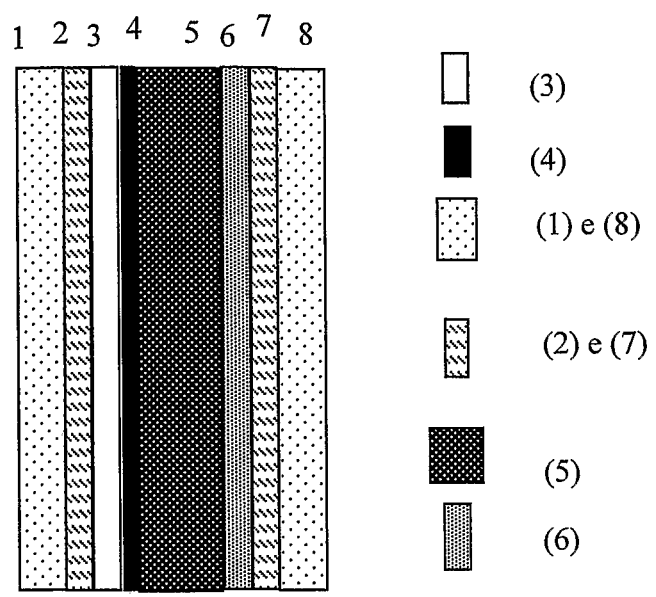
FIG. 1: Schematic representation of the photoelectrochemical device with legend, shown in section, where, in particular: (1) and (8) glass or other support material, (3) nanocrystalline semiconductive film, (4) natural dye, (2) and (7) FTO conductive thin layer, (5) electrolyte with electron mediator, (6) catalyst of Pt, C, or Au.
Figure 2:
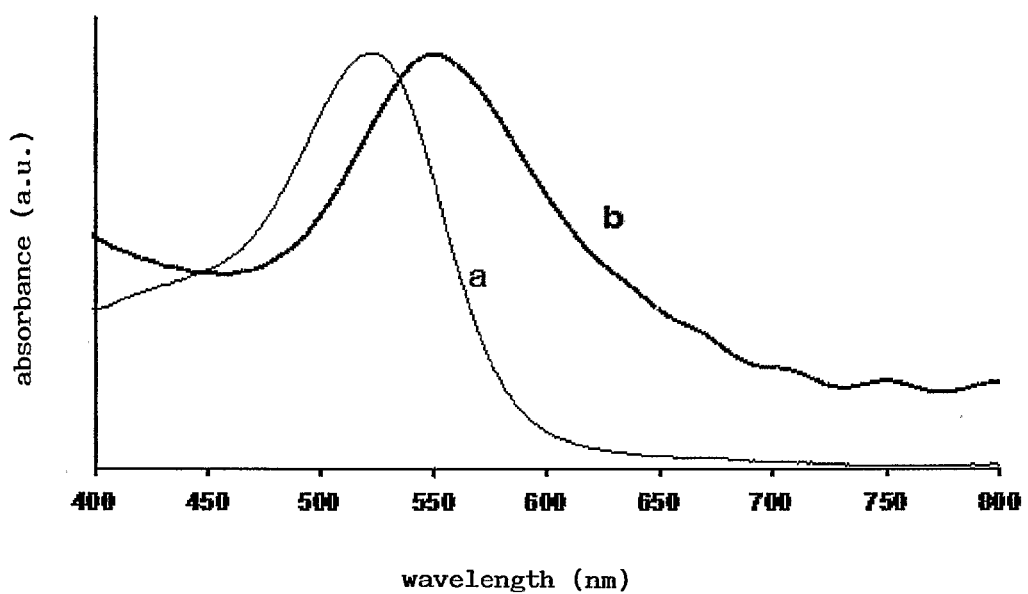
FIG. 2: Absorption spectra in aqueous solution (a) and in solid matrix (b), adsorbed on $TiO_2$ nanocrystals, of the nasunin dye extracted from the aubergine skin with the techniques and methods of the object of the present invention.
Figure 3:
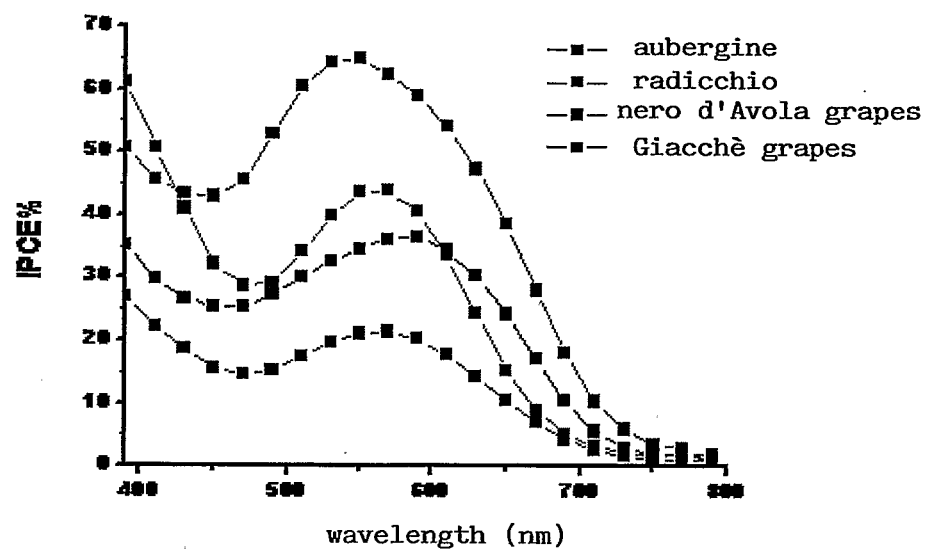
FIG. 3: photoaction spectra of some of the main natural dyes extracted with the methods reported in the present invention

According to a first object of the invention, the sensitizing dyes used in the photoelectrochemical solar cells are obtained from vegetal products. Particularly, such products can be fruits, greens, vegetables, plants, or flowers. Said vegetal products, particularly, contain compounds belonging to the family of the anthocyanins and/or betalains or their natural or synthetic derivatives.

The anthocyanins are among the most important pigment groups present in the plants [1,2]. In the anthocyanin group there are the most part of the dyes that are present in the petals, flowers, and fruits. In the anthocyanins, the monosaccharide or disaccharide is mainly bonded through glucosidic bond to the hydroxyl in position 3; in some anthocyanins, a second sugar residue appears bonded to the hydroxyl in position 5.

The formula of the general structure of the flavylium cation is represented herein below:

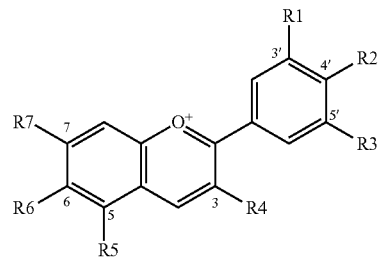

The following Table 1, instead, reports the different types of anthocyanidins that are present in nature and having different substitution groups. The food additives authorized at a European level are marked by a numerical code preceded by the letter "E" (E-number) and classified on the basis of their function.

TABLE 1

| Anthocyanidin | $R_1$ | $R_2$ | $R_3$ | $R_4$ | $R_5$ | $R_6$ | $R_7$ | E-number |
|---|---|---|---|---|---|---|---|---|
| Apigeninidin | —H | —OH | —H | —H | —OH | —H | —OH | |
| Aurantinidin | —H | —OH | —H | —OH | —OH | —OH | —OH | |
| Capensinidin | —OCH₃ | —OH | —OCH₃ | —OH | —OCH₃ | —H | —OH | |
| Cyanidin | —OH | —OH | —H | —OH | —OH | —H | —OH | E163a |

TABLE 1-continued

| Anthocyanidin | $R_1$ | $R_2$ | $R_3$ | $R_4$ | $R_5$ | $R_6$ | $R_7$ | E-number |
|---|---|---|---|---|---|---|---|---|
| Delphinidin | —OH | —OH | —OH | —OH | —OH | —H | —OH | E163b |
| Europinidin | —OCH$_3$ | —OH | —OH | —OH | —OCH$_3$ | —H | —OH | |
| Hirsutidin | —OCH$_3$ | —OH | —OCH$_3$ | —OH | —OH | —H | —OCH$_3$ | |
| Luteolinidin | —OH | —OH | —H | —H | —OH | —H | —OH | |
| Pelargonidin | —H | —OH | —H | —OH | —OH | —H | —OH | E163d |
| Malvidin | —OCH$_3$ | —OH | —OCH$_3$ | —OH | —OH | —H | —OH | E163c |
| Peonidin | —OCH$_3$ | —OH | —H | —OH | —OH | —H | —OH | E163e |
| Petunidin | —OH | —OH | —OCH$_3$ | —OH | —OH | —H | —OH | E163f |
| Pulchellidin | —OH | —OH | —OH | —OH | —OCH$_3$ | —H | —OH | |
| Rosinidin | —OCH$_3$ | —OH | —H | —OH | —OH | —H | —OCH$_3$ | |
| Triacetidin | —OH | —OH | —OH | —H | —OH | —H | —OH | |

The cyanin, which is among the most diffused anthocyanins, has the following formula.

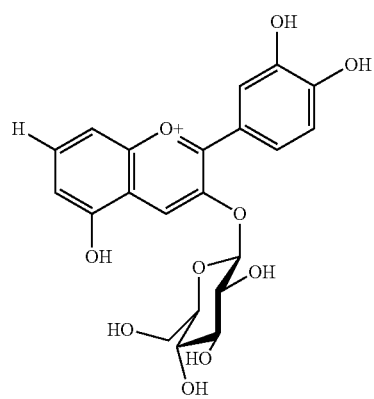

The anthocyanin present in the aubergine, termed nasunin, instead, has the following structure:

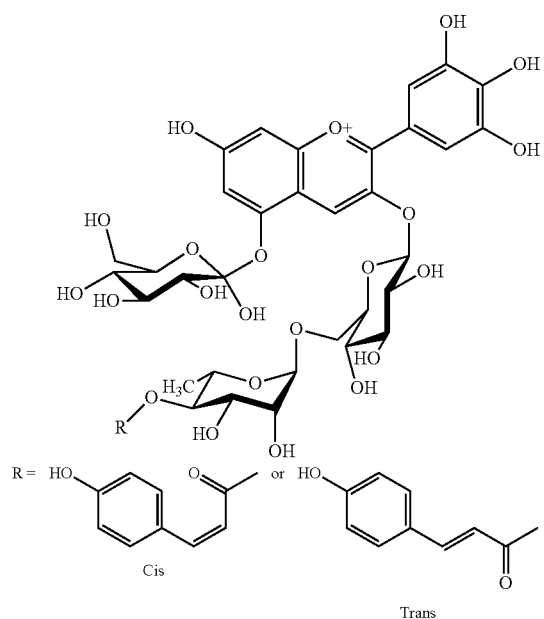

Instead, for the dyes derived from beets, such as, for example, red beets, Indian fig, and from flowers such as the bougainvillea, the dyes belong to the betalain family. Here below are reported some main structure formulae: betanidin, betanin, indicaxanthin, and betalamic acid, are reported herein below.

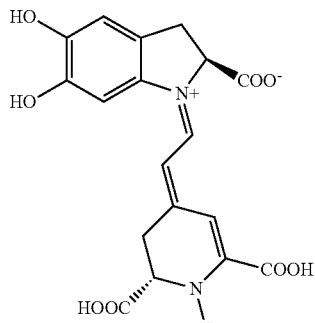

I Betanin R = β-D-glucose
II Betanidin R = H

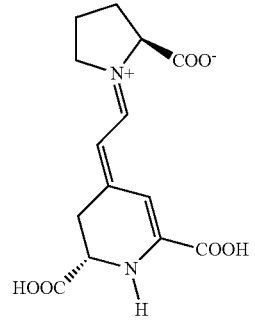

III Indicaxanthin

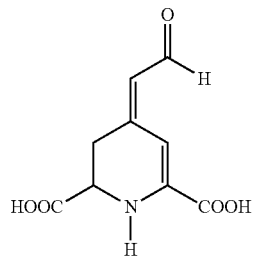

IV Betalamic Acid

Among the fruit from which it is possible to obtain the sensitizing dyes of the present invention there can be mentioned, for example, Sicily blood oranges, and more particularly the Moro di Lentini blood orange, the cherries, and more particularly, the Etna "ciliegino", the black and red mulberry, and the red and/or black grapes such as the Black Of Avola, Syrah, Giacchè, or Cabernet Sauvignon, blackberries, currants, plums, and Indian fig. Preferably, the dye of the invention is obtained from a typical variety of the Sicily blood oranges named the Moro di Lentini variety. The dye obtained from such particular variety is, indeed, defined as Moro dye. Another preferred dye for the invention is obtained from red mulberry.

Among the greens and the vegetables there can be mentioned, for example, aubergines, red radicchio, violet cauliflower and red cabbage, and beet or red beetroot.

Preferably, the dye of the invention is obtained from the red beet and is, indeed, defined red beet dye.

A further preferred dye is the Radicchio dye, obtained from the red radicchio.

Among the flowers, sources of sensitizing dyes are the roses, gardenias, hibiscus, and bougainvilleas.

In the oranges, cherries, mulberry, grapes, blackberries, currant, radicchio, and violet cauliflower, the principal dye compound of interest is the cyanin molecule (mentioned above) together with all the derivatives thereof containing sugar groups; in the aubergine, instead, the main component responsible for the sensitizing activity is nasunin, either in the cis or trans forms (mentioned above).

In the Indian fig, in the beet and in the flowers of bougainvillea, the dye of interest is made of a mixture of betalamic acid, betanin, betacyanidin, and indicaxanthin.

For the present invention, the starting material to obtain the sensitizing dyes of interest can be composed of the fresh vegetal products listed above, or from the juices obtained by pressing them.

Alternatively to the use of a single sensitizing dye, according to the second aspect of the present invention, the sensitizing dyes above described can be used in admixture. For example, there can be used mixtures of dyes obtained from different fruits, or obtained by admixing dyes obtained from different fruits, vegetables, plants, or flowers. The mixtures according to the present invention, particularly, have shown to unexpectedly and surprisingly have better characteristics than the compositions containing only one dye. Furthermore, such mixtures of dyes have advantageously shown to be able to extend and increase the absorption properties at the different wavelengths.

In fact, it has been observed that the mixtures of dye extracts, prepared with the methods described below, allow to increase the yield of conversion of light into electric current in DSSC. Particularly, by mixing in a 1:1 ratio the Moro dye, i.e., obtained from the Moro di Lentini blood oranges, with the Radicchio dye, i.e., obtained from the red radicchio, a final mixture is obtained, showing a surprising and unexpected increase of the yield of conversion of light into electric current, as it can be inferred from the data of Table 2, where said mixture is named "Silorio_MIX". Such mixture results to be advantageously stable for times longer than 1 year from its preparation and allows producing DSSC devices with a photocurrent output and photopotential stable for times longer than 12 months. Such stability has been found in all the dyes treated with the stabilization process, which represents a further object of the present invention.

In the case wherein the dyes of the invention are obtained starting from the vegetal material of origin, such as, for example, the fresh fruit or the vegetable, it has been ascertained the period wherein it is advisable to perform the harvest of the starting vegetal products, in order to obtain the maximum concentration possible of the antioxidant compounds of interest having a function of sensitizers.

For example, in the case of the oranges harvested in Sicily, the better period is from January to May; in the case of the black mulberry, the preferred seasonal period is the Summer-Spring period; for the grapes, the period is from August to October, while for the radicchio and aubergine there are no time limitations.

According to a third aspect of the invention, it is described a process for obtaining extracts of the sensitizing dye compounds with an anthocyanin structure from vegetal products, with the aim of maximizing the amount of extracted dye and to preserve the chemical properties thereof. Such products will be, for example, the Sicily blood oranges, and more particularly the Moro di Lentini blood orange, cherries, red and black mulberry, aubergines, red radicchio, violet cauliflower, red cabbage, violet cauliflower, strawberry, blueberry, currants, red and/or black grapes and the relative derivative products, blackberries, plums, and any other vegetal products or derivative thereof, also artificial, which contains dyes belonging to the family of the anthocyanins or betalains, such as, also, for example, beets, Indian figs, or flowers, such as bougainvilleas. The use of acids, such as chlorhydric acid or carboxylic acids, considerably increase the sensitizing activities of any natural dye and/or derivative thereof or the like.

For the extraction of the sensitizing dye compounds contained in the pulp of the fruit, initially, the operation starts by squeezing this latter one; the resulting juice is first acidified with weak organic mono- and di-carboxylic acids such as, for example, acetic acid, malic acid, tartaric acid, citric acid or salts thereof, which produce an acid hydrolysis in aqueous solution, so that the pH of the final solution is about pH=2.0; subsequently, it is acidified with inorganic acids such as, in particular, HCl, so as to bring the final pH to a value of 1.0. This technique allows obtaining a better performance compared to the direct acidification of the juice obtained from the pressing with concentrated inorganic acids. The thus obtained dye solution results to be stable for more than one year.

In the case in which the sensitizing dye is contained in the peels, instead, there proceeds by removing the peels themselves from the fruits; these are then put to macerate for 12 hours in the absence of light in an acid aqueous solution at pH=1.0 obtained by using strong inorganic acids such as, for example, chlorhydric acid, and then there proceeds with the addition of weak organic mono- or di-carboxylic acids such as, for example, malic acid, tartaric acid, citric acid, acetic acid or salts thereof, which produce an acid hydrolysis in aqueous solution and which act in this case only as co-adsorbers.

The mixture is then filtered with filter paper or gauze. The thus obtained solution results to be stable for at least one year without exhibiting degradation or alteration of the photophysical or photochemical properties. The thus obtained dyes are particularly stable and confer to the DSSC cells a stability of the photocurrent and the photopotential advantageously for a period of time longer than 12 months.

Instead, in order to extract the dye contained in the peels when these contain, in addition, chlorophyll and other molecules that could interfere with the anthocyanin dyes, such as, for example in the case of the aubergine or in the case of the grapes, it is necessary to proceed to a pre-treatment.

The pre-treatment, in particular, comprises the dipping step of the peels deprived from the inner spongy part in ethyl alcohol for a time interval of about 2-6 hours. The thus-obtained greenish solution is filtered, and the peels washed with water, after which they are dipped for 24 hours in the dark in an acidic solution at pH=1.0 obtained with inorganic acids such as, for example, chlorhydric acid mixed with weak organic mono- and di-carboxylic acids such as, for example, malic acid, tartaric acid, citric acid, acetic acid or salts thereof, which produce an acid hydrolysis in aqueous solution.

Particularly, it is preferred that the weight ratio between the weigh of the peels and that of the acid solution ranges between about 0.40 and 0.60 and that it is, still more preferably, about 0.53.

Advantageously, this process allows eliminating possible interferences and avoiding aggregation phenomena as well as energy annihilation processes between the molecules of sensitizer adsorbed on the photoanode.

The processes described before in the claims have been used for the first time in the world to stabilize and increase the sensitizing activity of the betalain dyes of beets, Indian figs, and bougainvillea flowers in the DSSC cells. In the literature, the red beets had been used in the DSSC but with scarce results [12,18]. Alternatively to the method previously described, to extract the sensitizing dye compounds of the invention from the aubergine skins, it is possible to use the technique named "Calorio bis" that has been developed by the authors of the present patent as a home-made ecologic method. According to this new procedure, the aubergine skins are put in a container, for example, metallic, with an equal weigh of distilled water; to the mixture, the juice of a lemon for each 20 g of skins and about 5 grams of sodium bicarbonate ($NaHCO_3$) is added. Then, it is heated at a temperature ranging between 40° C.-60° C., for a period of time ranging between 30 and 120 minutes, preferably 60 minutes, until the appearance of a violet coloration.

The mixture is then left to cool at room temperature and filtered. The solution containing the dye obtained by this procedure results to be advantageously stable for a time longer than one year, if preserved at a temperature of +4° C.

Therefore, the process for the extraction of the sensitizing dyes of the present invention is on the whole a not very expensive method and that can also be used for educational or training purposes. "CalorioBis" means the dye obtained according to the process of the present invention, exactly defined "CalorioBis".

Furthermore, all the processes of the present invention previously described are easily transferable to the industrial level, allowing in each case the unexpected and advantageous production of a dye that is stable for over one year and having excellent sensitizing properties for applications in photoelectrochemical solar cells based on nanocrystalline semiconductors, such as Titanium dioxide.

Furthermore, again according to the method described in the present invention, to obtain the sensitizing dyes with anthocyanin structure from vegetal products, it is important that the water volume added to the extract has a well-defined weight ratio: an excess or a defect alter the performance of the final solution. In accordance with that, the weight ratios between water and extract should be of 1:2.

The extracts of the stabilized and diluted dyes, as indicated in the present invention, are particularly and unexpectedly advantageous; in fact, final concentrations of anthocyanins are obtained, which do not originate aggregation phenomena, thereby avoiding, once they are adsorbed on the semiconductor of the anode of the device, the origination of energetic intermolecular transfer processes.

Again, according to such process, the obtained dyes are stabilized by the addition of acidic compounds. To this aim, for example, inorganic acids, weak mono- and di-carboxylic acids of natural origin, such as malic acid, citric acid, tartaric acid, acetic acid, cholic acids, deoxycholic acids, etc., can be advantageously employed.

Thanks to the stabilization method of the present invention, the degradation of the juices and, therefore, of the sensitizing dye compounds contained therein is efficiently reduced or even annulled for times ranging from some months to one year.

Furthermore, such addition of weak carboxylic acids showed to increase the yield of the charge injection from the dye to the semiconductor.

In fact, one of the problems which the natural anthocyanin dyes can give rise to is related to the possible modes of linkage to the photoanode semiconductor material through the hydroxyls that are present in their molecule. The linkage with the Titanium dioxide can occur, as it is known [7], both in the 5,6,7 position, where the molecule is more rich in electrons which occupy the molecular orbital at higher energy (HOMO) of the molecule, and in the 3',4',5' position, wherein there is a low electronic density and the non-occupied molecular orbitals at higher low energy (LUMO) are present. Only when the molecule is linked at the 3',4',5' positions, there is an efficient electronic transfer from the dye to the semiconductor. Two are the aspects that affect this behaviour: the first one is related to the structural formula of the natural dye and to the presence of glycoside and metoxy (—$OCH3$) groups that, with the steric encumbrance and chemical inertia thereof, direct the linkage between dye and semiconductor, while the other one relates to the kinetic control of the reactions optimizing the interaction between dye and semiconductor by consolidating the linkage between them. The latter can be carried out thanks to the management of the times, temperature, and concentration, as already mentioned. As for the betalain dyes, they have the functional group (—COOH), ideal for the linkage to $TiO_2$. Furthermore, the LUMO orbital for the betalains is near to the position in which the molecule links to $TiO_2$, injecting very efficiently the electron on the semiconductor [18,19].

Furthermore, a successive parameter that results to be critical with respect to the efficiency of these dyes in the photoelectrochemical solar cells is the control of the dipping times of the photoanodes. It has been observed that dye solutions maintained at a temperature of 4° C. give origin to the best results when the dipping time does not exceed two hours at a temperature of 20-25° C. Once terminated the adsorption cycle of the natural dyes on the photoanodes, the latter can be dried at a temperature of about 40° C. and used for the realization of the photoelectrochemical device.

The authors have been the first ones to use these processes on the anthocyanin and betalain dyes. On the whole, the process of the present invention provides for concentrations, times, processing temperatures, and acidity such as to allow an unexpected and surprising increase of the yield of conversion of light into electric current by the devices; furthermore, it is thus possible to obtain an unprecedented increase of the performance and stability of DSSC cells with natural sensitizers. For example, about the blackberry, previously studied by eminent authors [7], the process of the present invention leads to a 111% increase of the produced power efficiency, while on the Indian fig or red beet, more than 220%, as it can be verified by comparing the data of table 2 with the data reported in the literature for blackberries [7,8,12] and beets [12,18]; for Indian fig there exists no study performed, to date.

Therefore, according to a third object of the present invention, a photoanode is produced by a process including the dipping of the photoanode matrix in a solution containing one of the sensitizing dyes or a mixture of the sensitizing dyes of the invention, for a time not exceeding 2 hours and at a temperature of 20-25° C.

Particularly, the photoanode matrix [4] is of an inorganic nature, and comprises Titanium oxide, or ZnO, or other similar semiconductors.

A fourth object of the invention relates to the control of the pH of the solutions or mixtures of the dyes, which, depending on the type of sensitizing dye that is present, will have values ranging between 1 and 2.5. The invention will be better understood and implemented with reference to the annexed Tables and the graphs that illustrate some exemplary and non-limiting embodiments.

EXAMPLE 1

Construction of the Device

First, conductive glasses are cut, whose optimum thickness is of about 2.2 mm, having a transmittance in the visible not below 85%. Such glasses are coated with a FTO thin layer ($SnO_2$:F), which makes them electrically conductive (resistivity ~15 Ohm/sq); this type of materials, or similar products, are easily commercially available, and can be purchased from different specialty companies. For the realization of small cells assemblable in modules, the glasses are usually cut so as to obtain squares of about 10 cm×2 cm.

Preparation of the photoanode: a mask is laid on the cut glasses, with a 1 cm edge, a thickness of about 50 μm, and inner dimensions of 8 cm×0.7 cm, and then the Titanium dioxide paste is deposited, which, with the aid of a glass rod, is coated and evenly spread on the entire useful surface. The Titanium dioxide film is air dried for about 45', and after having removed the mask, the potential anode is sinterized in an oven at 450° C. for 30' and then let to cool spontaneously to room temperature; the thus obtained electrode is dipped in the solution containing the natural dye for a time not exceeding 2 hours and at a temperature of 20-25° C. The better performance has been obtained by using a commercial $TiO_2$ powder that is prepared by following a recipe reported in the literature [5] and that, also after the sinterization and sensitization process, can be easily removed from the anode, making the latter recyclable almost at 100% and ready for successive use. Alternatively, it is possible to use other types of commercial Titanium dioxide pastes containing nanoparticles having a diameter of about 5-25 nm [4.20]. The dye is absorbed on the anode according to the procedure and the solutions described in the present invention and after having been dried in oven at 50° C. for about 60', it is coated by the conventional platinum or carbon counterelectrode and sealed with a thermoplastic resin (surlyn or other equivalent sealing material) having a thickness of a few tens μm. The operation is carried out with a hot press for some minutes.

Preparation of the cathode: there are selected the supports that can be conductive glass plates as the one described for the photoanode (thickness about 2-3 mm), which cut to similar dimensions, but different materials can also be used, metallic, plastics, ceramics, bricks, stone, wood, cloth or fabric, etc., suitably made conductive. On them, the catalyst, which can be platinum or carbon or gold is deposited.

Platinum can be deposited in different manners:

By chemical way, using an isopropyl solution of $H_2PtCl_6$, which is homogeneously spread on the support, the all is then sinterized at 400° C. for about 1 hour.

By electrochemical way, using an isopropyl solution of $H_2PtCl_6$, and carrying out the electrolysis.

By thermal route, using thermo-vaporizers for metals, or sputter.

Gold can be deposited with the same methods of platinum, or also in nanoparticles [21].

The carbon-based catalyst can be deposited using amorphous carbon solutions or carbon nanotubes. For training purposes, the graphite that is present in the pencils or carbon black can be used.

Preparation of the electronic mediator: the electrolytic liquid is preferably formed of methoxypropionitrile; however, also acetonitrile, propylcarbonate, methoxyacetonitrile, ethyl alcohol, ethylene glycol, ethylene carbonate, liquid ionic salts, etc., lithium iodide (0.5 M-0.8 M), and iodine (0.03 M-0.08M) have been successfully used, and is introduced through a hole of a few millimeters, drilled with a column drill on the counterelectrode before the cell is assembled.

In order to promote such filling, the cell is horizontally placed in a dryer with the cathode facing upwardly and some drops of electrolytic solution are applied thereon, then a vacuum is applied. Then, a small square of sealing is applied on the hole and hot pressed for a few minutes with a small laboratory slide. The electrodes are placed offset one to the other, thereby leaving space for optional electrical contacts, or for arranging them in series with one another by blocking them with clips. The conductive uncoated parts of the cells are coated with metallic paint so as to reduce possible ohmic losses at the contacts. The above-mentioned invention, such as is devised, is susceptible of variations and improvements, which fall the inventive concept.

EXAMPLE 2

Performance of the Inventive Dyes

The experiments relating (Isc, Voc, ff, Pmax, Imax, Vmax, stability) to the activity of sensitizers for some of the main natural dyes of the present invention used in photoelectrochemical solar cells have been compared to a standard artificial dye based on a Ruthenium dicarboxylic polypyridine complex under similar conditions (referred to as the artificial complex N3, see Table 2). Furthermore, the experimental data of the same complex have been reported when the latter is treated with 0.5 M TBP (tert-butylpyridine).

Figure 4:
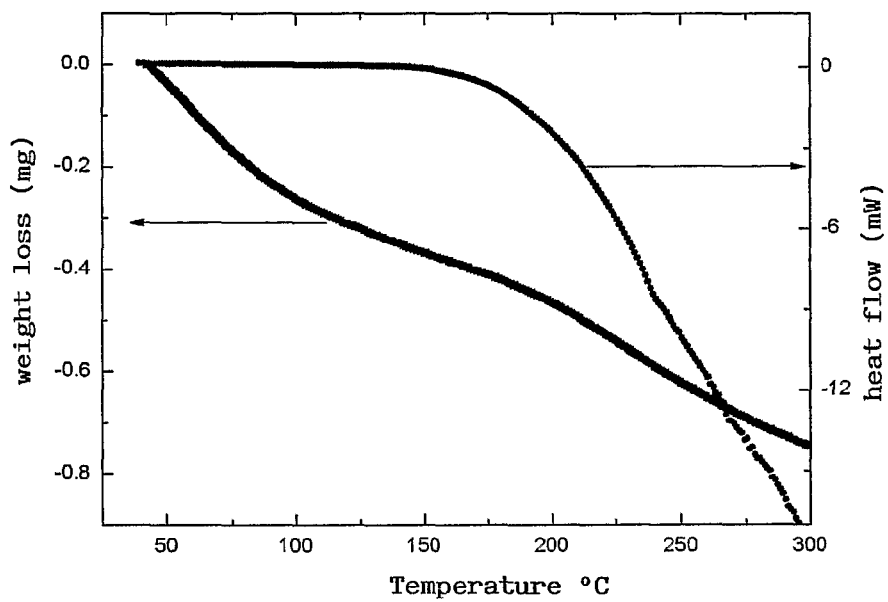
FIG. 4: trend of the thermograms relating to the calorimetric and thermogravimetric response of dye, extracted from aubergine skins, adsorbed in $TiO_2$ nanocrystalline powder.

The natural dye, although it is subjected to this thermal treatment, remains stable. Calorimetric and thermogravimetric measurements have confirmed this behaviour (see FIG. 4). In particular, the sample used for such analysis consists in $TiO_2$ nanocrystals on which the dye extracted from the aubergine (nasunin) is adsorbed, by proceeding exactly as if the substrate should be prepared for the photoanode. The calorimetric measurements have been carried out in a differential scanning calorimeter in a temperature range of 25° C.-300° C., and using about 10 mg sample, while the thermogravimetric measurements have been carried out with a simultaneous scanning calorimeter, but assessing only the sample weight variation in the same temperature range, but using about 100 mg material. The heating ramps were 5° C./min. As it can be noticed, the thermograms show discontinuities at about 150° C., in fact, the calorimetric one exhibits, starting from this temperature, the beginning of a exothermal trend probably related to the beginning of the dye decomposition, which stops at ~240° C.; this is confirmed by the thermogravimetric analysis, which first shows a constant weight loss due to the release of the residual water present in the initial powder, to increase then at 240° C., where a change in the slope of both the curves under examination is observed (there is the overlapping of a further thermo-structural process of the titanium oxide, which however is beyond our current interest).

In Table 2, the experimental values obtained for some photoelectrochemical solar cells (0.5 cm² area) subjected to lighting by a solar simulator under conditions AM 1.5 (i.e., 100 mW/cm$^2$ of irradiated light power) are reported. Particularly, short circuit current (Jsc) is reported for each cell, open circuit voltage (Voc), maximum current (Jmax), maximum voltage (Vmax), light power used (Light), irradiated light-produced current conversion yield (yield). The artificial dye termed N3 is inserted as a reference, and is cis-(SCN)$_2$Bis(2-2'-bipyridyl-4,4'-dicarboxylate) ruthenium (II), which is among the best artificial sensitizers of the world [20].

As it can be seen from the table, the three best natural dyes are abundant and easily available.

TABLE 2

| Dye | Jsc (ma/cm$^2$) | Voc (V) | Jmax (ma/cm$^2$) | Vmax (V) | Light mW/cm$^2$ | Yield (%) |
|---|---|---|---|---|---|---|
| Artificial complex N3 + Tert-butylpyridine (TBP) | 10.94 | 0.675 | 9.15 | 0.475 | 100 | 4.40 |
| Artificial complex N3 | 10.87 | 0.475 | 8.46 | 0.300 | 100 | 2.54 |
| Red beet (*Beta vulgaris* var. *Rubra*) | 10.00 | 0.425 | 6.00 | 0.225 | 100 | 1.50 |
| Indian fig (*Opuntia ficus-indica*) | 7.69 | 0.375 | 5.76 | 0.225 | 100 | 1.30 |
| Red Mulberry (*Morus rubra*) | 5.69 | 0.375 | 4.8 | 0.25 | 100 | 1.20 |
| Etna sour cherry (*Prunus cerasus L.*) | 4.99 | 0.350 | 3.6 | 0.25 | 100 | 0.90 |
| blackberry (*Rubus ulmifolius*) | 4.68 | 0.350 | 3.85 | 0.225 | 100 | 0.89 |
| Black plum (*Prunus domestica*) | 5.41 | 0.350 | 3.82 | 0.225 | 100 | 0.86 |
| Silorio Mix | 4.36 | 0.35 | 3.65 | 0.225 | 100 | 0.82 |
| Moro Orange (*Citrus sinensis*) | 3.81 | 0.375 | 3.16 | 0.25 | 100 | 0.79 |
| Black mulberry (*Morus nigra*) | 4.01 | 0.375 | 3.31 | 0.225 | 100 | 0.74 |
| Giacchè (*Vitis vinifera*) | 3.8 | 0.325 | 3.1 | 0.225 | 100 | 0.70 |
| Radicchio $^a$ (*Cichorium intybus*) | 3.97 | 0.325 | 3.08 | 0.200 | 100 | 0.61 |
| CalorioBis (*Solanum melongena*) | 3.82 | 0.325 | 2.98 | 0.200 | 100 | 0.60 |
| Aubergine (*Solanum melongena*) | 2.44 | 0.325 | 2.03 | 0.225 | 100 | 0.46 |
| Untreated blueberry (*Vaccinium Myrtillus*) | 2.31 | 0.325 | 1.93 | 0.25 | 100 | 0.48 |
| Untreated red beet (*Beta vulgaris* var. *Rubra*) | 2.75 | 0.35 | 2.04 | 0.275 | 100 | 0.46 |
| Untreated blackberry (*Rubus ulmifolius*) | 1.57 | 0.4 | 1.39 | 0.3 | 100 | 0.42 |
| Untreated Indian fig (*Opuntia ficus-indica*) | 1.77 | 0.4 | 1.45 | 0.275 | 100 | 0.40 |

BIBLIOGRAPHY

[1] E. N. Kananykyna, I. V. Pilipenko, Chemistry of Natural Compound, 36 (2000)148.
[2] B. V. Chandler, Nature 182 (1958)933
[3] M. A. Livrea, L. Tesoriere, J. PACD (2006)73
[4] B. O'Regan, M. Gratzel, Nature 353 (1991) 737.
[5] A. Kay, M. Gratzel, J. Phys Chem. 97 (1993) 6272.
[6] Y. Amao, Y. Yamada, K. Aoki, J. Photochem. Photobiol. A: Chem 164 (2004) 47.
[7] N. J. Cherepy, G. P. Smestad, M. Gratzel, J. Z. Zhang, J. Phys. Chem B. 101 (1997) 9342.
[8] G. P. Smestad, Sol. Energy Mater. Sol. Cells 55 (1998) 157.
[9] Q. Dai, J. Rabani, Chem. Commun. (2001) 2142.
[10] Q. Dai, J. Rabani, New J. Chem. 26 (2002) 421.
[11] Q. Dai, J. Rabani, J. Photochem. Photobiol. A. 148 (2002) 17.
[12] D. Zhang, N. Yamamoto, T. Yoshida, H. Minoura, Trans. MRS-J., 27 (2002) 811.
[13] J. Simiyu, B. O. Aduda, J. M. Mwabora, Prog. Colloid polym. Sci. 125 (2004)34.
[14] A. S. Polo, N. Y. Murakami Iha, Sol. Energy Mater. Sol. Cells 90 (2006) 1936.
[15] S. Hao, J. Wu, Y. Huang, J. Lin, Solar Energy 80 (2006) 209.
[16] K. Wongcharee, V. Meeyoo, S. Chavadej, Sol. Energy Mater. Sol. Cells 91 (2007) 566.
[17] J. M. R. C. Fernando, G. K. R. Senadeera, Current Science (Research Communications), vol. 95, 5, sett. 2008.
[18] D. Zhang S. M. Lanier, J. A. Downing, J. L. Avent, J. Lum, J. L. McHale. J. Photochem. Photobiol. A: Chem 195 (2008) 72.
[19] C. Qin, A. E. Clark, Chem. Phys. Lett. 438 (2007)26.
[20] M. K. Nazeeruddin, A. Kay, I. Rodicio, R. Humphry-Baker, E. Muller, P. Liska, N. Vlachopolous, M. Gratzel, J. Am. Chem. Soc. 115 (1993) 6382.
[21] W. H. Lai, Y. H. Su, L. G. Teoh, M. H. Hon, J. Photochem. Photobiol. A 195 (2008)307.

The invention claimed is:
1. A process for obtaining stable extract of sensitizing betalainic dyes of vegetal origin from beets, Indian figs, buganvillea or other natural products containing betalains comprising the steps of:
   a) obtaining an extract of sensitizing betalainic dyes of vegetal origin from beets, Indian figs, buganvillea or other natural product containing betalains;
   b) acidifying said extracts by first adding a weak organic mono- or di-carboxylic acid to pH=2 and then adding an inorganic acid to pH=1; and c) diluting said extracts with water so that the weight ratio between water and extract volume is about ½.

* * * * *